United States Patent
Li et al.

(10) Patent No.: US 8,395,228 B2
(45) Date of Patent: Mar. 12, 2013

(54) INTEGRATION PROCESS TO IMPROVE FOCUS LEVELING WITHIN A LOT PROCESS VARIATION

(75) Inventors: Wai-Kin Li, Beacon, NY (US); Wu-Song Huang, Brewster, NY (US); Dario Leonardo Goldfarb, Dobbs Ferry, NY (US); Martin Glodde, Mahwah, NJ (US); Edward Engbrecht, Hopewell Junction, NY (US); Yiheng Xu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 12/941,375

(22) Filed: Nov. 8, 2010

(65) Prior Publication Data
US 2012/0112302 A1    May 10, 2012

(51) Int. Cl.
*H01L 21/02*    (2006.01)
(52) U.S. Cl. .................. 257/437; 257/435; 257/E31.127
(58) Field of Classification Search .................. 257/437, 257/436, 435, 431, 428, 414
See application file for complete search history.

(56) References Cited

U.S. PATENT DOCUMENTS

| | | |
|---|---|---|
| 6,420,088 B1 | 7/2002 | Angelopoulos et al. |
| 6,720,256 B1 | 4/2004 | Wu et al. |
| 7,485,573 B2 | 2/2009 | Angelopoulos et al. |
| 7,547,635 B2 | 6/2009 | Eppler et al. |
| 7,582,412 B2 | 9/2009 | Cameron et al. |
| 7,727,704 B2 | 6/2010 | Taniguchi et al. |
| 7,727,902 B2 | 6/2010 | Takei et al. |
| 2006/0200983 A1* | 9/2006 | Shimamura et al. ............ 29/847 |
| 2009/0208865 A1 | 8/2009 | Brunner et al. |
| 2010/0022089 A1 | 1/2010 | Takei et al. |

FOREIGN PATENT DOCUMENTS
JP  2004152997  5/2004

* cited by examiner

*Primary Examiner* — Marcos D. Pizarro
*Assistant Examiner* — Eva Yan Montalvo
(74) *Attorney, Agent, or Firm* — Catherine Ivers Wenjie Li; Ira D. Blecker

(57) ABSTRACT

A method of improving the focus leveling response of a semiconductor wafer is described. The method includes combining organic and inorganic or metallic near infrared (NIR) hardmask on a semiconductor substrate; forming an anti-reflective coating (ARC) layer on the combined organic NIR-absorption and the inorganic or metallic NIR-absorption hardmask; and forming a photoresist layer on the ARC layer. A semiconductor structure is also described including a substrate, a resist layer located over the structure; and an absorptive layer located over the substrate. The absorptive layer includes an inorganic or metallic NIR-absorbing hardmask layer.

31 Claims, 4 Drawing Sheets

INTEGRATION PROCESS TO IMPROVE FOCUS LEVELING WITHIN A LOT PROCESS VARIATION

TECHNICAL FIELD

The invention relates to generally to photolithographic methods within microelectronic fabrication. In particular, the invention relates to a structure method for improving focus-leveling response of a semiconductor wafer. More in particular, the invention relates to a novel integration process to improve focus leveling within a lot process variation.

BACKGROUND

The process of fabricating a semiconductor structure within a semiconductor substrate, or another type of microelectronics structure within another type of microelectronic substrate, typically includes the use of a resist layer that is selectively exposed and subsequently developed while using an exposure apparatus and then a development apparatus to form a patterned resist layer that is used as a mask layer for selectively forming a particular semiconductor structure, or a particular microelectronic structure, within and upon the semiconductor substrate or the microelectronic substrate.

While using resist layers and exposure apparatuses are thus common within the semiconductor and microelectronic fabrication art, these are nonetheless not entirely without problems within the fabrication art. In particular, a proper exposure of a substrate having a resist layer located thereover within an exposure apparatus may often be compromised by spurious light effects. In addition, such compromised exposure in turn may lead to unacceptable resist features, such as improperly sized contact holes, that are formed from such compromised exposure of a blanket resist layer.

Although there are various process flows for focus leveling semiconductor wafers, there are numerous dependent errors. For example, FIG. 1 shows a schematic diagram of an optical sensor scheme having a silicon (Si) substrate 10 with gate dielectric 12 and a silicon dioxide (SiO2) layer 14 having a contact (e.g. damascene) lines 16. A bottom anti-reflective coating (BARC) layer 18 is formed over the SiO2 layer 14. Finally, a resist layer 20 formed upon the BARC layer 18. The exposure apparatus illustrated in FIG. 1 uses an incident vertical alignment beam 22 that emanates from a vertical alignment beam source 24. This vertical alignment produces a leveling sensor measured plane 26. Similarly, a lens 28 emitting a blue image is aimed at the structure, producing an actual blue image plane 30.

The drawbacks of the optical sensor method, as illustrated by FIG. 1, include, inter alia, the fact that part of the light will penetrate through the resist and BARC materials and bounce back when reflective structures corresponding to the optical sensor light wavelength are present, such as, for example, metal lines, gate structures or other reflective substrates. Therefore, the optical sensor will receive multiple signals from sub-structures, leading to focus errors, etc. Moreover, the optical sensor measurement results is highly influenced by the pattern density, for example, wafer to wafer process variation such as film thickness, CD, CMP, etc.

Another method of focus leveling is the so-called AGILE measurement. The AGILE measurement combines the optical leveling sensor measurement described above and then focuses the correction files based on both AGILE and leveling sensor measurement data. Thus, during the current AGILE process flow, a first wafer is taken from the lot. Then, first an AGILE measurement and then a leveling sensor measurement is conducted. Then a focus correction file is generated based on both AGILE and leveling sensor data. This focus correction data is then applied on to the rest of the wafers on the lot. The assumption is that the AGILE process captures the real wafer surface plane, thus by using both optical level sensor and the correction data would generate the same outcome of the AGILE process. However, while the data measured by the AGILE measurement may be optimal, as discussed hereinabove, the optical leveling sensor measurement is highly influenced by wafer to wafer process variation such as film thickness, CD, CMP, etc. In addition, the focus correction file may not be able to well represent the focus leveling offset of the rest of the wafers due to wafer variation. Moreover, while the AGILE method is an improvement over the optical sensor method for obtaining better wafer surface data, it is mechanically intensive and time consuming.

All of the methods described above, namely, both the AGILE measurement and the optical leveling sensor measurement methods have their drawbacks. For example, the AGILE measurement method cannot capture the wafer to wafer variation and impede wafer throughput. Optical leveling sensor method causes focus error by sub-structure reflectivity.

Other methods for photolithography focus improvements have been devised. For example, commonly owned U.S. application Ser. No. 12/033,303, the entire contents of which are incorporated by reference, describes a method for improving focus sensor performance by subsiding patterned substrate reflection. In particular, the Ser. No. 12/033,303 application describes an anti-reflective having a near-infra red (NIR) dye coating material for attenuating secondary alignment beam radiation reflected in the structure when aligning the substrate. Thus, to minimize reflection from the patterned substrate, a highly broadband absorptive layer is put down before resist coating. This broadband absorptive layer will absorb most of the diffraction light. However, while this method uses only one wafer, it is very difficult for the NIR dye itself to absorb all the UV signals.

Lithographic methods, lithographic materials and lithographic apparatus are certain to remain useful as semiconductor and microelectronic fabrication technology advances. Accordingly, a need exist for improved lithographic methods, lithographic materials and lithographic apparatus having enhanced performance. The present disclosure provides structure and methods of improved focus leveling response of a semiconductor wafer.

SUMMARY

The present disclosure is directed to a structure and method of improving the focus leveling response of a semiconductor wafer. A back end of line (BEOL) integration scheme is described. In one embodiment, a semiconductor structure is described. The structure includes a substrate; a resist layer located over the structure; and an absorptive layer located over the substrate, where the absorptive layer includes an inorganic hardmask layer. The hardmask layers are near infrared dye (NIR)-absorbing layers. The absorptive layer further includes an organic NIR-absorbing layer. The structure further includes an anti-reflective coating (ARC) layer formed on at least one of the organic NIR-absorbing layer and the inorganic NIR-absorbing layer. In one particular embodiment, the ARC layer includes silicon. In another particular embodiment, the absorptive layer includes a combination of inorganic or metallic NIR-absorbing hardmask and organic or metallic NIR-absorbing layer. In yet another embodiment, the absorptive layer includes an inorganic or metallic NIR-absorbing hardmask.

The absorptive layer is formed to absorb a predetermined diffraction light. In one particular embodiment, the NIR-absorbing hardmask of the absorptive layer absorbs a wavelength between approximately 600 and approximately 1200 nanometers. In another embodiment, the absorptive layer includes a single layer of material having a combination of inorganic or metallic NIR absorption hardmask and organic NIR-absorption hardmask.

The absorptive layer may be located interposed between the resist layer and the substrate layer. Alternatively, the resist layer may be located interposed between the absorptive layer and the substrate layer. In other embodiments, the resist layer and the absorptive layer comprise a single layer.

In another embodiment, a method for improved focus leveling response of a semiconductor wafer is described. The method includes forming an inorganic or metallic near infrared (NIR)-absorbing hardmask layer on a semiconductor substrate; forming an organic NIR-absorbing layer on the inorganic or metallic NIR-absorbing hardmask layer; forming an anti-reflective coating (ARC) layer on the organic NIR-absorbing layer; and forming a photoresist layer on the ARC layer. In one particular embodiment, the ARC layer includes silicon. In another embodiment, the inorganic or metallic NIR-absorbing hardmask layer and the organic NIR-absorbing layer form an absorptive layer, where the NIR includes a wavelength between approximately 600 and approximately 1200 nanometers.

In yet another embodiment, a method for focus leveling a semiconductor wafer is described. The method includes forming at least one of an inorganic or metallic near infrared (NIR)-absorbing hardmask layer and an organic NIR-absorbing layer on a semiconductor substrate; forming an anti-reflective coating (ARC) layer on the at least one inorganic or metallic NIR-absorbing hardmask layer and organic NIR-absorbing layer; and forming a photoresist layer on the ARC layer. In this particular embodiment, the step of forming at least one of an inorganic or metallic near infrared (NIR)-absorbing hardmask layer and an organic NIR-absorbing layer on a semiconductor substrate includes forming the inorganic or metallic NIR-absorbing hardmask on the semiconductor substrate and forming the organic NIR-absorbing layer on the inorganic or metallic NIR-absorbing hardmask. The inorganic or metallic NIR-absorbing hardmask and the organic NIR-absorbing layer form an absorptive layer, where the NIR includes a wavelength between about 600 and about 1200 nanometers.

Other features of the presently disclosed structure and method of improved focus leveling response on BEOL integrated wafer will become apparent from the following detailed description taken in conjunction with the accompanying drawings, which illustrate, by way of example, the presently disclosed structure and method.

BRIEF DESCRIPTION OF THE DRAWINGS

The features of the presently disclosed method of improved focus leveling within a lot process variation will be described in detailed hereinbelow, with references to the accompanying drawings, in which.

DETAILED DESCRIPTION

Figure 1:
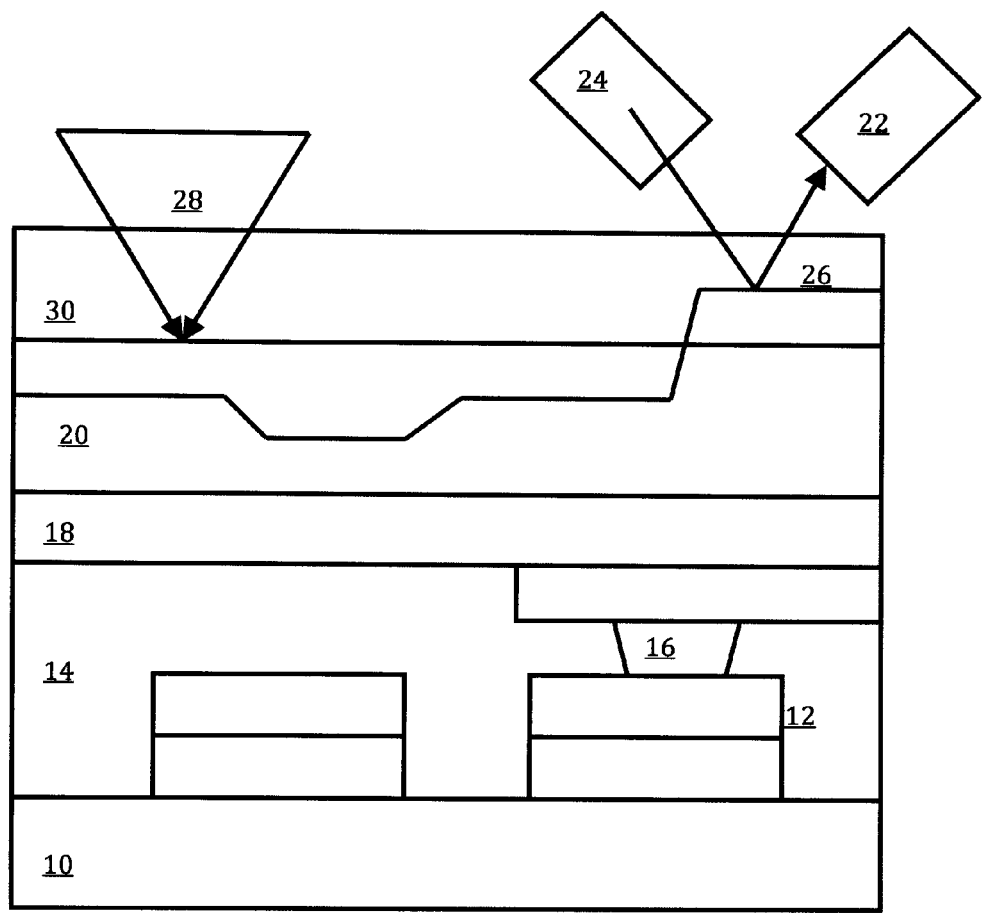
FIG. 1 is a simplified schematic diagram of a micro-electronic substrate illustrating an optical leveling sensor, in accordance with the microelectronic fabrication found in the prior art.

Referring now to the drawing figures, wherein like reference numerals identify identical or corresponding elements, an embodiment of the presently disclosed structure and method of improved focus leveling response of a semiconductor wafer, will be described in detail. In the following description, numerous specific details are set forth, such as particular structures, components, material, dimensions, processing steps and techniques, in order to provide a thorough understanding of the disclosure. However, one skilled in the art will appreciate that the invention may be practiced without these specific details. In other instances, well-known structures or processing steps have not been described in detail to avoid obscuring the invention.

The structure described herein can be made using conventional techniques of back end of the line (BEOL) processing known to those skilled in the art. In addition, front end of the line (FEOL) and middle end of the line (MOL) processing are also envisioned.

With reference to FIGS. 2-5, a BEOL integration scheme is illustrated describing a BEOL integration technique. In this particular embodiment, a structure is illustrated including a dielectric formed on a semiconductor substrate (not shown) and containing therewithin a first interconnect feature or metal contact. To improve optical sensor measurement, and in accordance with the present disclosure, an organic near infrared (NIR) dye layer is combined with an inorganic or metallic hardmask, such as, for example, titanium nitride (TiN). A silicon (Si) containing bottom anti-reflective coating (ARC) layer is then formed and finally, a photoresist layer is formed on the ARC layer. In this new integration technique there is minimum or no focus correction data variation.

Figure 3:
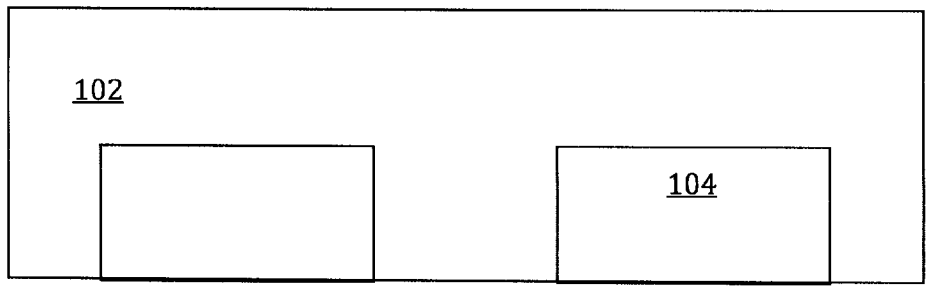
FIGS. 3 and 4 illustrate exemplary processing steps for forming the semiconductor substrate of FIG. 2.
Figure 4:
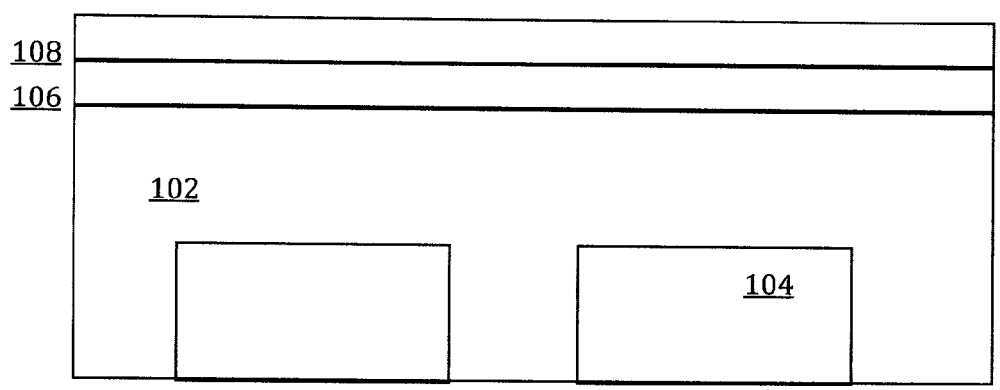
Figure 5:
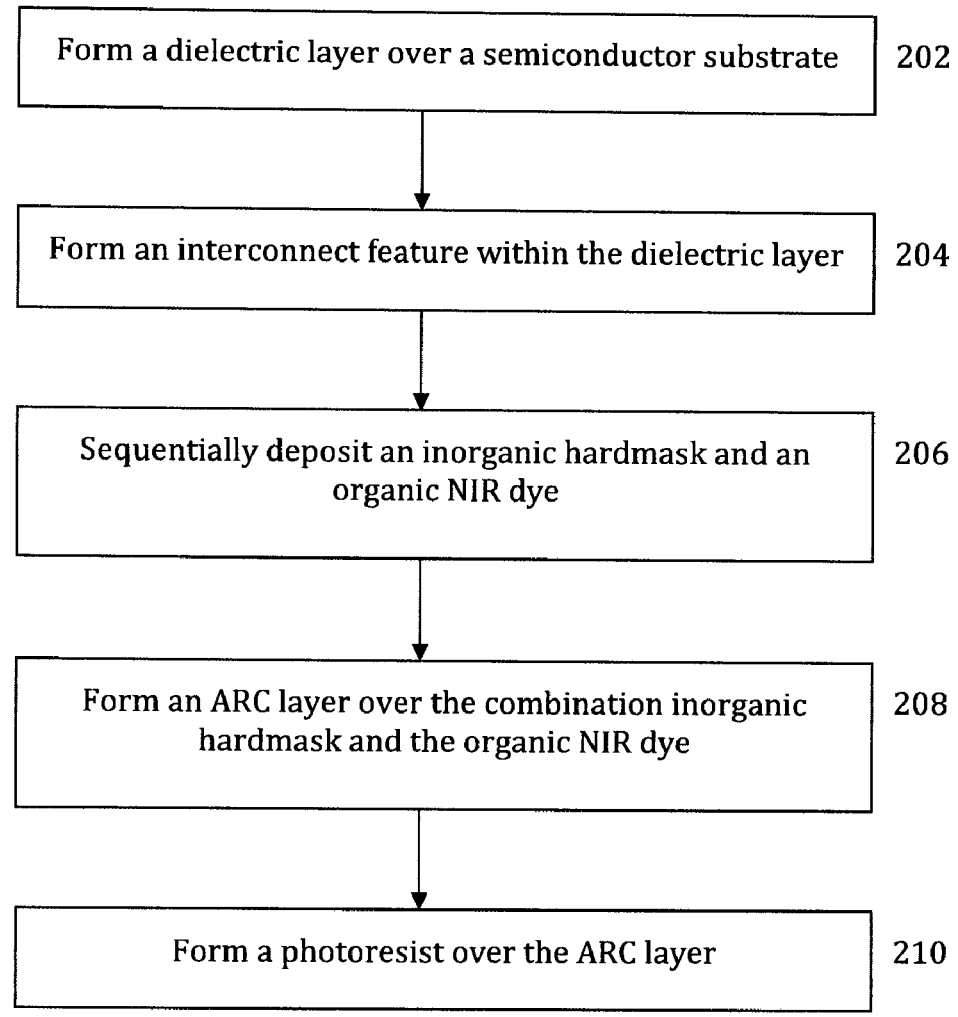
FIG. 5 is an exemplary flow diagram illustrating the method of forming the improved focus leveling response of a semiconductor wafer, in accordance with the present disclosure.

In accordance with one embodiment of the present disclosure, FIGS. 3-5 illustrate an exemplary process of forming an improved focus leveling response of a semiconductor wafer by combining NIR dye organic planarizing layer (OPL) and inorganic or metallic hardmask layer, such as, for example, TiN. In particular, a dielectric 102 is formed over a semiconductor substrate (not shown) having therein a metal level or interconnect feature 104. An inorganic or metallic hardmask 106 is formed over dielectric 102. A NIR dye OPL 108 is then formed over the inorganic or metallic hardmask 106. A bottom anti-reflective coating (ARC) layer 110 is then formed on the organic NIR dye OPL 108. Finally, a photoresist layer 112 is formed on the ARC layer 110, in a manner described in detailed herein below.

With particular reference to FIG. 3, the semiconductor substrate (not shown) may include any of several microelectronic materials well known in the art. Non-limiting examples include conductor materials, semiconductor materials and dielectric materials. Commonly, the substrate may include a ceramic substrate material. More commonly, the substrate includes a semiconductor substrate material. Non-limiting examples of semiconductor substrate materials include silicon, germanium, silicon-germanium alloy, silicon-carbon alloy, silicon-germanium-carbon alloy and compound semiconductor materials (i.e. III-V and KK-VI) semiconductor materials. In particular, non-limiting examples of compound semiconductor materials include gallium arsenide, indium arsenide and indium phosphate semiconductor material. Typically, semiconductor substrate may be about, but is not limited to, several hundred microns thick, for example a thickness ranging from about 0.5 mm to about 1.5 mm.

In one embodiment, dielectric layer 102 includes a dielectric constant, k, of about 4.0 or less and a thickness ranging from about 200 nm to about 450 nm. Dielectric layer 102 may include any interlevel or intralevel dielectric, and may be porous or non-porous. Suitable materials include, but are note limited to, SiN, SiO2, Si3N4, SiCOH, SILK (a polyarylene ether available from Dow Chemical Corporation), JSR (a spin-on silicon carbon contained polymer material available from JSr Corporation), silesquioxanes, C doped oxides (i.e. organosilicates) that include atoms of Si, C, O, and/or H, thermosetting polyarcylene ether, etc. or layers thereof. It is understood, however, that other materials having different dielectric constant and/or thickness may be employed.

It is noted that when the substrate includes a semiconductor substrate material, the substrate may include microelectronic devices located and formed therein and/or thereupon that are otherwise generally conventional in the semiconductor fabrication art. Such semiconductor devices may include, but are not necessarily limited to, resistors, transistors, diodes and capacitors.

With continued reference FIG. 3, metal level or interconnect features 104 are formed using techniques well known in the microelectronic art. Interconnect features 104 include a conductor material and a highly resistive diffusion barrier (not shown) to prevent conductive material from diffusing. The diffusion barrier is deposited using atomic layer deposition (ALD), or alternatively, a chemical vapor deposition (CVD) may be used. The conductor material may be selected from a material including, for example, Cu, Al, W, TiN, TaN, Ta, Mo, their alloys, and any suitable conductive material. The highly resistive diffusion barrier may be selected from a material including Ta, TaN, TiN, Ru, RuN, W, WN, or any other barrier material.

With reference to FIG. 4, a hardmask layer 106 is formed over the dielectric 102 and the interconnect feature 104. The hardmask 106 is an inorganic or metallic hardmask 106 which may be selected from a variety of material. Examples of the inorganic NIR-absorbing hard mask material may contain any of the conducting or semiconducting metal nitrides, oxides, carbides, silicides and the mixtures thereof. Examples of the conducting or semiconducting metal nitrides include TiN, TaN, CrN, GaN, $Cu_3N$, InN, ReN, NbN, and ZrN. Examples of the conducting or semiconducting metal oxides include $In_2O_3$, $SnO_2$, ZnO, RuO, PbO, $Cr_2O_3$, $Ga_2O_3$, $RhO_2$, NiO, CoO, PdO, PtO, $CuAlO_2$, CdO, and $CuGaO_2$. Examples of the metallic NIR-absorbing hard mask material may contain, for example, W, Ti, Ta, Cr, Ni, Al and/or Cu. In one particular embodiment, the inorganic or metallic hardmask 106 includes TiN.

With continued reference to FIG. 4, an organic NIR dye organic planarizing layer (OPL) is then deposited over the inorganic or metallic hardmask layer 108. Example of organic NIR dye OPL contains one or more near infra absorbing polymethine dyes and one or more crosslinkable polymers. In accordance with the present disclosure, combining the organic NIR dye layer 108 and inorganic or metallic hardmask 106 forms an absorption layer to improve focus leveling.

Figure 2:
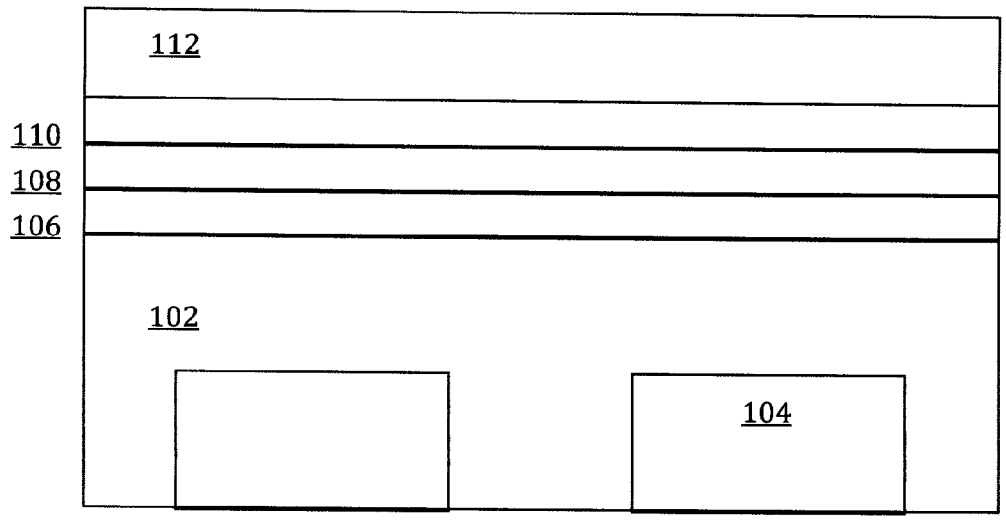
FIG. 2 illustrates a simplified cross-sectional view of an exemplary back end of the line integration scheme of a semiconductor substrate having a metal contacts with an inorganic or metallic hardmask and an organic NIR-dye formed thereon, in accordance with one embodiment of the present disclosure.

With reference to FIG. 2, an ARC layer 110 is formed over the NIR dye OPL layer 108. The ARC layer 110 includes an anti-reflective material having optical absorption properties within the context of the specific wavelength regions that are described herein below. Such anti-reflective coating layer 110 may include a single layer or an aggregate of layers that provide the above described absorption properties in the corresponding wavelength regions that are described above. In one particular embodiment, the ARC layer 110 includes silicon. It is noted that the bottom ARC layer 110 may be an anti-reflective coating material or an anti-reflective coating layer. Alternatively, a first layer of a bi-layer or multi-layer ARC layer may include an absorptive material with absorbance characteristics in the 600-1200 nanometer range while a second layer of a bi-layer ARC layer may include an absorptive material with absorbance characteristic in less than approximately 300 nanometer range.

Further, while the above disclosure is directed to an ARC layer that includes infrared absorptive dye, which is typically an organic material, neither the embodiment nor the structure and method described herein is intended to be so limited. Rather, the embodiment and the structure and method described herein also contemplate that particular anti-reflective coating layers, in accordance with the present disclosure, may include purely organic materials, purely inorganic materials, purely metallic materials or composites of inorganic materials, metallic materials and inorganic materials.

In one broad embodiment, ARC layer 110 includes an anti-reflective coating material that attenuates reflection via absorption (with an extension coefficient greater than about 0.3) at a vertical alignment beam wavelength (which will typically be in a near infrared wavelength region greater than about 600 nm and preferably from about 800 to about 1200 nm). In another embodiment, ARC layer 110 includes an anti-reflective coating material that attenuates reflection via absorption (with an extinction coefficient greater than about 0.3) at a vertical alignment beam wavelength (which will typically be in a near infrared wavelength region greater than about 600 nm) and attenuates reflection via absorption (with an extinction coefficient from about 0.08 to about 0.7) at an exposure radiation wavelength (which will typically be less than 300 nm and more preferably from about 12 to about 300 nm and most preferably 193 nm and 248 nm), while transmitting (absent an absorption peak, and with an extinction coefficient less than about 0.1) at a horizontal alignment beam wavelength (which will typically be in a visible range from about 400 to about 700 nm).

With continued reference to FIGS. 4 and 2, a photoresist layer 112 is then formed over ARC layer 110. Photoresist layer 112 includes any of several resist materials formed to thicknesses well known in the microelectronic fabrication art.

With reference to FIG. 5, in conjunction with FIGS. 2-4, a flow diagram of an exemplary method of forming a semiconductor wafer having improved focus leveling response, in accordance with the present disclosure, is illustrated. A device structure, such as, for example, an SOI wafer is provided having a semiconductor substrate (not shown in the figures), a dielectric layer 102 and metal interconnects 104, as discussed hereinabove. In accordance with the present disclosure, initially, at step 202, a dielectric layer 102 is formed on a semiconductor substrate. At step 204, an interconnect features 104 are formed within dielectric 102. At step 206, an inorganic or metallic hardmask 106 and an organic NIR dye OPL 108 are sequentially deposited over dielectric 102 and interconnect features 104 to form an absorptive layer. At step 208, an ARC layer 110 is formed over the combination inorganic or metallic hardmask 106 and the organic NIR dye 108. At step 210, a photoresist 112 is then formed over ARC layer 110.

Using the method described in the present disclosure, the focus leveling is improved. It will be understood that numerous modifications and changes in form and detail may be made to the embodiments of the presently disclosed structure and method of improved focus leveling. It is contemplated that numerous other configurations of the wafer may be used. In particular, it is contemplated that the materials of the structure and method may be selected from numerous materials other than those specifically disclosed. Therefore, the above description should not be construed as limiting the disclosed structure and method, but merely as exemplification of the various embodiments thereof. Those skilled in the art will envision numerous modifications within the scope of the present disclosure as defined by the claims appended hereto. Having thus complied with the details and particularity required by the patent laws, what is claimed and desired protected is set forth in the appended claims.

What is claimed is:

1. A semiconductor structure comprising:
a substrate;
a resist layer located over the structure; and
an absorptive layer located over the substrate, wherein the absorptive layer includes an inorganic or metallic near infra red dye (NIR)-absorbing hardmask layer.

2. The semiconductor structure of claim 1, wherein the absorptive layer further includes an organic NIR-absorbing layer.

3. The semiconductor structure of claim 1, wherein the inorganic or metallic NIR-absorbing hardmask layer absorbs a wavelength approximately between 600 and 1200 nanometers.

4. The semiconductor structure of claim 1, wherein the NIR includes a wavelength approximately between 800 and 1200 nanometers.

5. The semiconductor structure of claim 1, further comprising an anti-reflective coating (ARC) layer formed on the inorganic or metallic NIR-absorbing layer.

6. The semiconductor structure of claim 1, wherein the absorptive layer is located interposed between the resist layer and the substrate layer.

7. The semiconductor structure of claim 1, wherein the absorptive layer absorbs a predetermined diffraction light.

8. A method for improving optical sensor measurements in a semiconductor wafer, the method combining:
forming an inorganic or metallic near infra red dye (NIR)-absorbing hardmask on a dielectric layer, the dielectric layer formed on a semiconductor substrate;
forming an organic NIR-absorbing layer on the inorganic NIR or metallic hardmask; and
forming an anti-reflective coating (ARC) layer on the organic NIR-absorbing layer.

9. The method for improving optical sensor measurement as recited in claim 8, further comprising forming a photoresist layer on the ARC layer.

10. The method for improving optical sensor measurement as recited in claim 8, wherein the inorganic or metallic NIR-absorbing hardmask includes TiN.

11. The method for improving optical sensor measurement as recited in claim 8, wherein the inorganic or metallic NIR-absorbing hardmask and the organic NIR-absorbing layer form an absorptive layer 12. The method for improving optical sensor measurement as recited in claim 8, wherein the ARC includes Si.

13. The method for improving optical sensor measurement as recited in claim 8, wherein the NIR includes a wavelength approximately between 800 and 1200 nanometers.

14. A method for focus leveling a semiconductor wafer, the method comprising:
forming an absorptive layer on a semiconductor substrate, the absorptive layer including a combination of inorganic or metallic near infra red dye (NIR)-absorbing hardmask and organic or metallic NIR-absorbing layer;
forming an anti-reflective coating (ARC) layer on the absorptive layer; and
forming a photoresist layer on the ARC layer.

15. The method of focus leveling as recited in claim 14, wherein the inorganic or metallic hardmask layer includes TiN.

16. The method of focus leveling as recited in claim 14, wherein the ARC layer includes silicon.

17. The method of focus leveling as recited in claim 14, wherein the inorganic or metallic NIR-absorbing hardmask and the organic NIR-absorbing layer form an absorptive layer.

18. A semiconductor structure comprising:
a substrate;
a resist layer located over the structure;
an absorptive layer located over the substrate, wherein the absorptive layer includes an inorganic or metallic near infra red dye (NIR)-absorbing hardmask layer; and
an anti-reflective coating (ARC) layer formed on the inorganic or metallic NIR-absorbing layer wherein the anti-reflective coating (ARC) layer includes silicon.

19. The semiconductor structure of claim 18, wherein the absorptive layer further includes an organic NIR-absorbing layer.

20. The semiconductor structure of claim 19, wherein the organic NIR-absorbing layer is an organic planarizing layer (OPL).

21. The semiconductor structure of claim 18, wherein the inorganic or metallic NIR-absorbing hardmask layer absorbs a wavelength approximately between 600 and 1200 nanometers.

22. The semiconductor structure of claim 18, wherein the NIR includes a wavelength approximately between 800 and 1200 nanometers.

23. The semiconductor structure of claim 18, wherein the absorptive layer is located interposed between the resist layer and the substrate layer.

24. The semiconductor structure of claim 18, wherein the absorptive layer absorbs a predetermined diffraction light.

25. A semiconductor structure comprising:
a substrate;
a resist layer located over the structure; and an absorptive layer located over the substrate, wherein the absorptive layer includes an inorganic or metallic near infra red dye (NIR)-absorbing hardmask layer and an organic NIR-absorbing layer wherein the organic NIR-absoring layer is an organic planarizing layer (OPL).

26. The semiconductor structure of claim 25, wherein the inorganic or metallic NIR-absorbing hardmask layer absorbs a wavelength approximately between 600 and 1200 nanometers.

27. The semiconductor structure of claim 25, wherein the NIR includes a wavelength approximately between 800 and 1200 nanometers.

28. The semiconductor structure of claim 25, further comprising an anti-reflective coating (ARC) layer formed on the inorganic or metallic NIR-absorbing layer.

29. The semiconductor structure of claim 28, wherein the ARC layer includes silicon.

30. The semiconductor structure of claim 25, wherein the absorptive layer is located interposed between the resist layer and the substrate layer.

31. The semiconductor structure of claim 25, wherein the absorptive layer absorbs a predetermined diffraction light.

\* \* \* \* \*